(12) United States Patent
Toba et al.

(10) Patent No.: US 7,514,785 B2
(45) Date of Patent: Apr. 7, 2009

(54) SEMICONDUCTOR DEVICE AND MANUFACTURING METHOD THEREOF

(75) Inventors: Susumu Toba, Nagano (JP); Akira Morozumi, Nagano (JP); Kazuo Furihata, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 293 days.

(21) Appl. No.: 11/337,687

(22) Filed: Jan. 24, 2006

(65) Prior Publication Data

US 2006/0186520 A1    Aug. 24, 2006

(30) Foreign Application Priority Data

Feb. 3, 2005  (JP)  ............................. 2005-027164

(51) Int. Cl.
    *H01L 23/34*    (2006.01)
(52) U.S. Cl. ................. 257/713; 257/717; 438/121; 361/707
(58) Field of Classification Search ................ 257/712, 257/713, 717, 720, E23.101, E23.109, E23.11, 257/E23.106; 438/121, 122; 361/748–810
    See application file for complete search history.

(56) References Cited

U.S. PATENT DOCUMENTS

| 6,441,312 | B1 * | 8/2002 | Tanimura et al. ............ 174/252 |
| 7,053,492 | B2 | 5/2006 | Takahashi et al. |
| 2002/0060356 | A1 | 5/2002 | Nishibori et al. |

FOREIGN PATENT DOCUMENTS

JP    06-244224    9/1994

\* cited by examiner

*Primary Examiner*—Zandra Smith
*Assistant Examiner*—Paul E Patton
(74) *Attorney, Agent, or Firm*—Manabu Kanesaka

(57) ABSTRACT

A semiconductor device includes a solder dam for restricting the flow of solder during manufacturing. The device includes a semiconductor chip bonded to a first side of a circuit board, a metal base for dissipating heat produced by the semiconductor chip, the metal base being bonded to a second side of the circuit board, and a dam material disposed on the metal base in a predetermined pattern for restricting the flow of solder used in bonding a plurality of the circuit boards to the metal base. By employing the solder dam, solderability is not impaired, device contamination can be avoided, and a highly reliable semiconductor device can be produced.

8 Claims, 4 Drawing Sheets

SEMICONDUCTOR DEVICE AND MANUFACTURING METHOD THEREOF

BACKGROUND OF THE INVENTION AND RELATED ART STATEMENT

This invention relates to a semiconductor device and a manufacturing method thereof, and particularly to a semiconductor device such as a power module made by bonding semiconductor device chips to one side of a circuit board and bonding a metal base for dissipating heat produced in the semiconductor device chips to the other side, and a manufacturing method thereof.

In the manufacture of semiconductor devices such as power modules, bonding of multiple heat-sinking, electrically insulating boards to a metal base is carried out by soldering. At this time, in related art, a commercially available solder resist has been printed onto the metal base and dried to prevent solder flow (see, for example, JP-A-6-244224). And, in assembly environments where solder resist cannot be used, solder bonding has been carried out with the boards fixed with a positioning jig or the like.

There is also the method of forming an oxide film on or in depressions in the metal base with a laser beam to prevent solder flow, but when the amount of solder is large (in terms of thickness, 0.05 mm or greater) this is largely ineffective.

However, with the solder resist of related art there has been the problem that cost and time are entailed in making up a screen for printing, and in process steps from printing to drying.

And, with solder resist, because it is generally an organic substance such as epoxy resin, its resistance to solder heat is not exceedingly high. When, for example, fluxless soldering is carried out in a hydrogen gas atmosphere, solderability has been impaired by the production of outgas from the solder resist. There are also problems such as contamination of the device, and thus use has been limited.

The present invention was made in view of such prior art problems. It is an object of the invention to provide a semiconductor device and a manufacturing method thereof with which the creation of a dam material for preventing solder flow is easy, and furthermore, with which reliability is high.

Further objects and advantages of the invention will be apparent from the following description of the invention and the associated drawings.

SUMMARY OF THE INVENTION

To solve the problems described above and other problems, the invention provides a semiconductor device having semiconductor chips bonded to one side of a circuit board and a metal base for dissipating heat produced in the semiconductor chips bonded to the other side, wherein a dam material is disposed on the metal base by being painted in a predetermined pattern so as to restrict the flow of a solder used in bonding a plurality of the circuit boards to the metal base.

With this construction, by means of the dam material disposed on the metal base by being painted in a predetermined pattern, flow of the solder used in bonding the multiple circuit boards to the metal base is restricted.

And, a second aspect of the invention provides a semiconductor device using an inorganic substance with a high solder heat resistance as the dam material, and by this means the production of outgas during soldering is prevented.

In the invention, as opposed to the solder resist of the above-described related art, the flow of the solder used in bonding multiple circuit boards to a metal base is restricted by means of a dam material disposed on the metal base by being painted in a predetermined pattern. It is possible, therefore, to easily make a semiconductor device in which solder flow during soldering can be prevented. And, because making up of a printing screen and printing are not carried out, reductions in cost can also be expected.

And, because an inorganic substance with a high solder heat resistance and no solderability is used as the dam material, the production of outgas during soldering can be prevented. Consequently, at the time of soldering, solderability is not impaired, device contamination can also be avoided, and a highly reliable semiconductor device can be produced.

DETAILED DESCRIPTION OF THE PREFERRED EMBODIMENTS

A preferred embodiment of the invention will be described in detail below with reference to the drawings.

Figure 1:
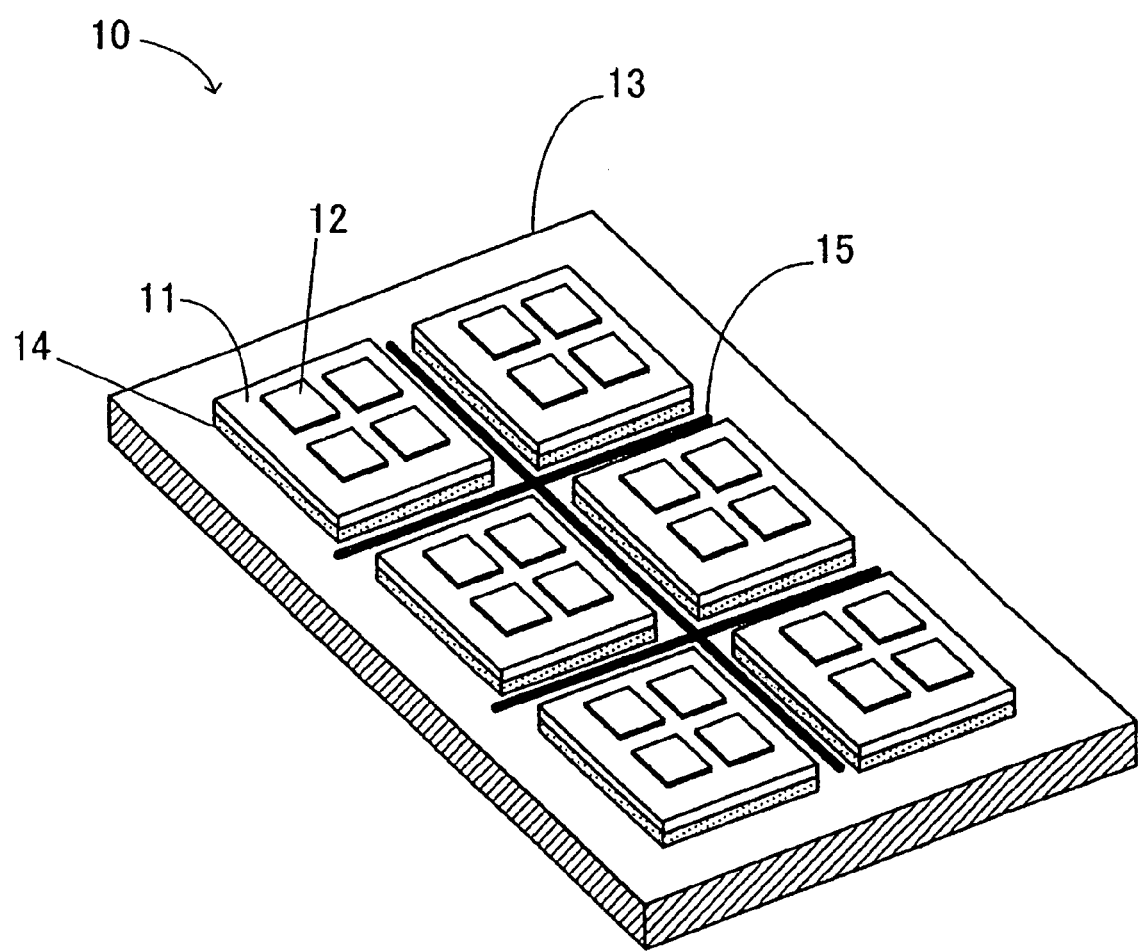
FIG. 1 is a perspective view of a main part of a semiconductor device according a preferred embodiment of the invention.

FIG. 1 is a perspective view of a main part of a preferred embodiment of a semiconductor device according to the invention.

The semiconductor device 10 of this preferred embodiment is made by bonding semiconductor chips 12 to one side of a circuit board 11 and bonding to the other side a metal base 13 for dissipating heat produced in these semiconductor chips 12. A dam material 15, for restricting the flow of a solder 14 used in the bonding of a plurality of the circuit boards 11 to the metal base 13, is disposed on the metal base 13.

The circuit board 11 is a heat-dissipating electrically insulating board made by bonding conductor patterns to the front and rear sides of a ceramic board by direct bonding or active metal bonding or the like, and in the following description it will be assumed that a DCB (Direct Copper Bonding) board made by bonding copper to the front and rear sides of a ceramic board is being used.

The semiconductor chips 12 are, for example, devices for use in a power module such as IGBTs (Insulated Gate Bipolar Transistors), and are bonded to the circuit boards 11 with solder (not shown).

The metal base 13 is a heat sink having the function of dissipating heat produced in the semiconductor chips 12 mounted on it, and, for example, Cu (copper) plated with Ni (nickel) is used.

The dam material 15, which is a characteristic feature of this preferred embodiment, is formed on the metal base 13 as a dam part in a predetermined pattern by painting, thermal spraying, or plating.

FIGS. 2A and 2B and FIGS. 3A and 3B are views showing patterns of the dam part.

Figure 2A:
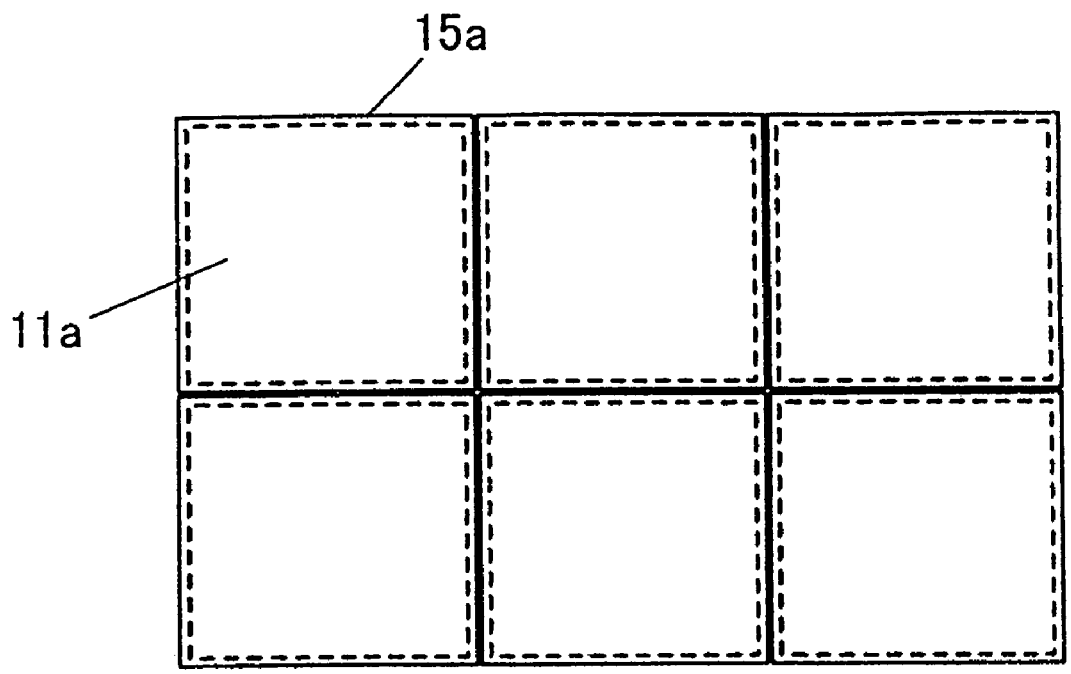
FIGS. 2A and 2B are plan views showing a dam part pattern according to one embodiment of the invention.
Figure 2B:
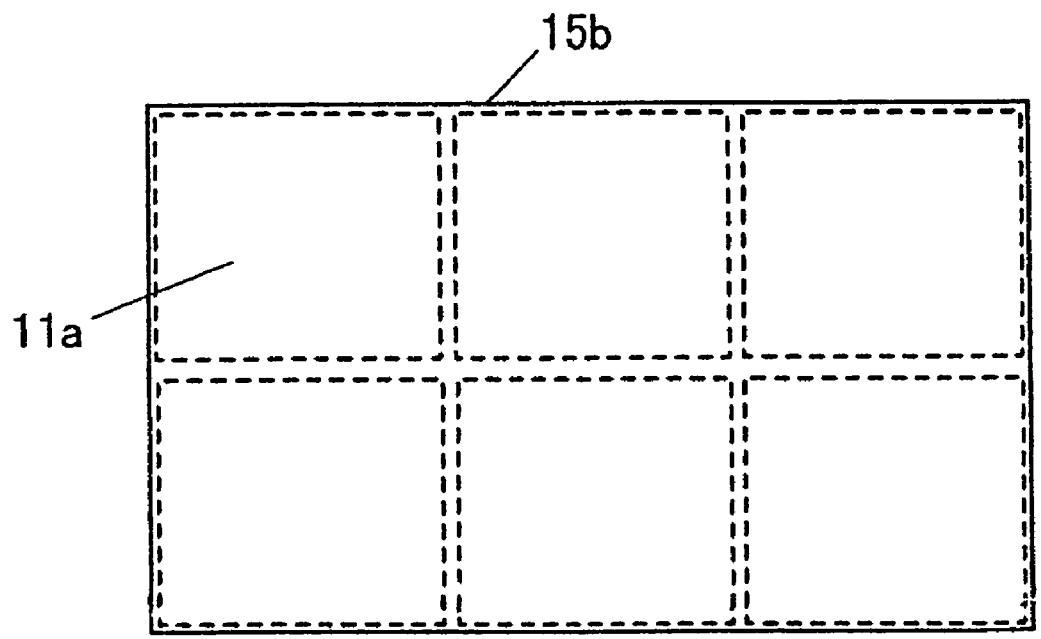

The pattern of the dam part 15a shown in FIG. 2A is a typical one, and is a pattern in which the dam part 15a is formed so as to surround the copper plate peripheries 11a of the rear sides of the circuit boards 11 (shown with dashed lines (and similarly in the other drawings)). FIG. 2B shows a pattern in which a dam part 15b is formed so as to surround the copper plate peripheries 11a of six circuit boards 11. This is used when the quantity of solder is small and the outflow of solder between the circuit boards 11 is small.

Figure 3A:
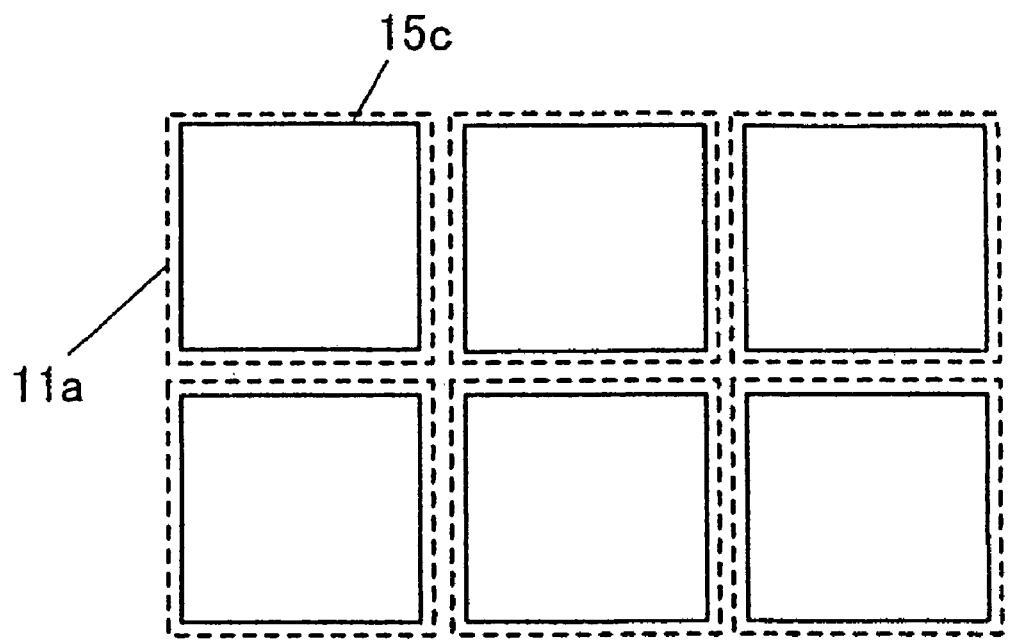
FIGS. 3A and 3B are plan views showing a dam part pattern according to another embodiment of the invention.
Figure 3B:
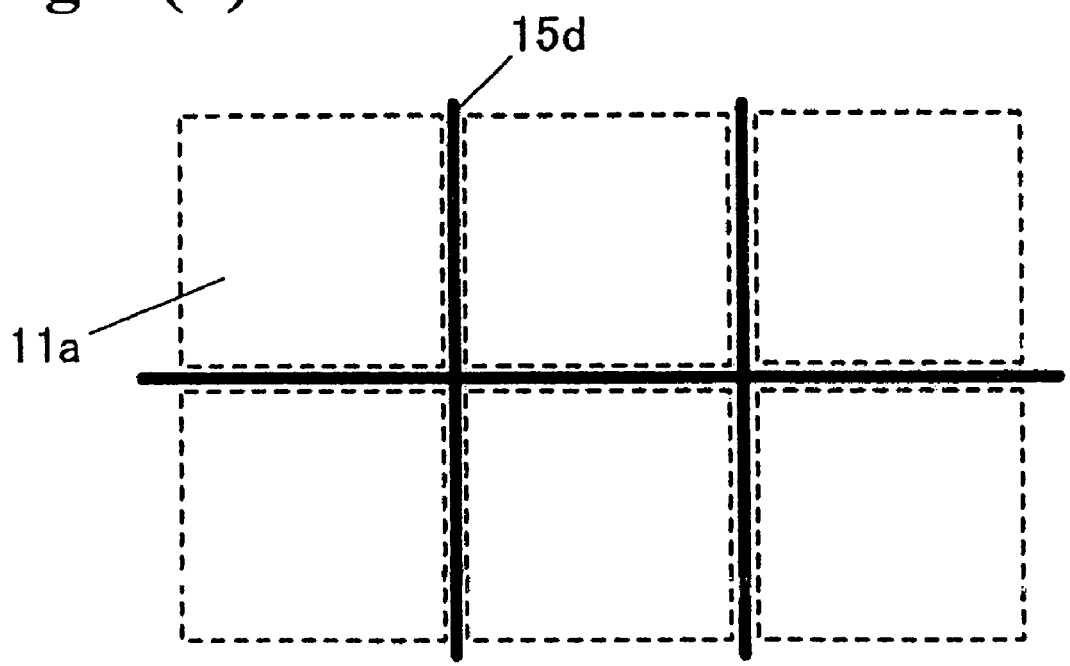

The pattern of a dam part 15c shown in FIG. 3A is an example in which the dam part is formed to the same dimensions as or slightly smaller than the copper plate peripheries 11a of the rear sides of the individual circuit boards 11. And the pattern of the dam part 15d shown in FIG. 3B is an example in which the dam part is formed only between the copper plate peripheries 11a of the circuit boards 11, and is the same as the one shown in FIG. 1. When the quantity of solder used is large, if the dam part 15d having a large width of pattern is formed, as shown in this FIG. 3B, the outflow of solder can be prevented effectively. And if no pattern is formed on sides where any outflow of solder is not problematic, solder will flow to those sides during soldering and the outflow of solder on sides where outflow must be prevented can be prevented effectively.

A method of forming the dam material 15 will now be described.

As the substance used for the dam material 15, one having an inorganic substance with a high solder heat resistance and no solderability as a main component is used. Specifically, one having particles of carbon or a ceramic as a main component and made by mixing these particles with a volatile binder is used. As a dam material having a ceramic as its main component, a ceramic adhesive used for bonding ceramic members can be applied. Ceramic adhesives have silicic acid and boric acid as main components, and can withstand temperatures in excess of 1000° C. or higher.

However, among ceramic adhesives, one in which no organic binder remains after drying is used. In this case it can be used for soldering in a hydrogen reducing atmosphere. In the case of a ceramic material, by choosing one with good electrical insulating properties and by coating it thickly, it is possible to further increase the dam effect and electrical insulation.

By means of these materials, for example using fine coating technology using a dispenser, a dam material 15 with a predetermined pattern can be formed on the metal base 13 by painting. A screen printing method may alternatively be used. By this means it is possible to manufacture a large volume of mass-produced product efficiently by in-line automation. High quality, high reliability, low cost, and shortening of the production time of the semiconductor device 10 can also be achieved.

And, as the dam material 15, a solid carbon such as the core of a pencil may alternatively be used. Although the core of a pencil contains clay besides carbon, this is not a problem in soldering, and the effect of repelling solder is the greater. In painting with a pencil, for example, a template is superimposed and the pattern is painted through the template. In order to deposit more carbon on the metal base 13, the hardness of the core of the pencil is preferably 2B to 6B. After painting, unwanted residue (carbon) (i.e., residue that is loose on the surface of dam material 15) is removed with air or the like.

Although pattern painting may be carried out automatically using a dispenser on the basis of digital data, particularly in the case of pencil painting, painting may be carried out by hand. This is suitable for high-mix low-volume production. In this case also, quality, reliability, low cost, and shortening of production time can be achieved.

And, a dam material 15 having a metal with a low solder wettability (i.e., such that solder does not spread) or a ceramic as a main component may be thermally sprayed onto the metal base 13 to form a dam part. Thermal spraying is a method of forming a film by melting or softening a coating substance by heating it, accelerating it in fine particle form, and causing it to impact with the surface of the object to be coated, and setting and accumulating particles having collapsed flat. Thermal spraying methods include room-temperature thermal spraying and plasma thermal spraying. Examples of metals of low solder wettability include Al (aluminum), Mo (molybdenum), W (tungsten), and Cr (chromium). Thermal spraying increases cost slightly, but can be applied to a variety of materials, and the thickness can be easily set so that materials suitable to the application of products can be selected.

And, with dam materials such as chromium, it is possible to form a dam part with a predetermined pattern by plating. Because with plating the thickness can be kept below 0.01 mm, it is used when it is desirable to limit the thickness. And Cr plating in a predetermined pattern can be carried out following a step of Ni-plating the metal base 13.

By forming a dam part like this on the metal base 13, it is possible to restrict solder flow, and there is no production of outgas during soldering as there is when a solder resist made from an organic substance such as an epoxy resin is used. Consequently, at the time of soldering, there is no impairment of solderability, and device contamination can also be avoided.

When a carbon jig for board positioning and a partition board such as a carbon material are further used for a semiconductor device 10 of the construction described above, it is possible to prevent outflow of solder still more effectively.

Figure 4:
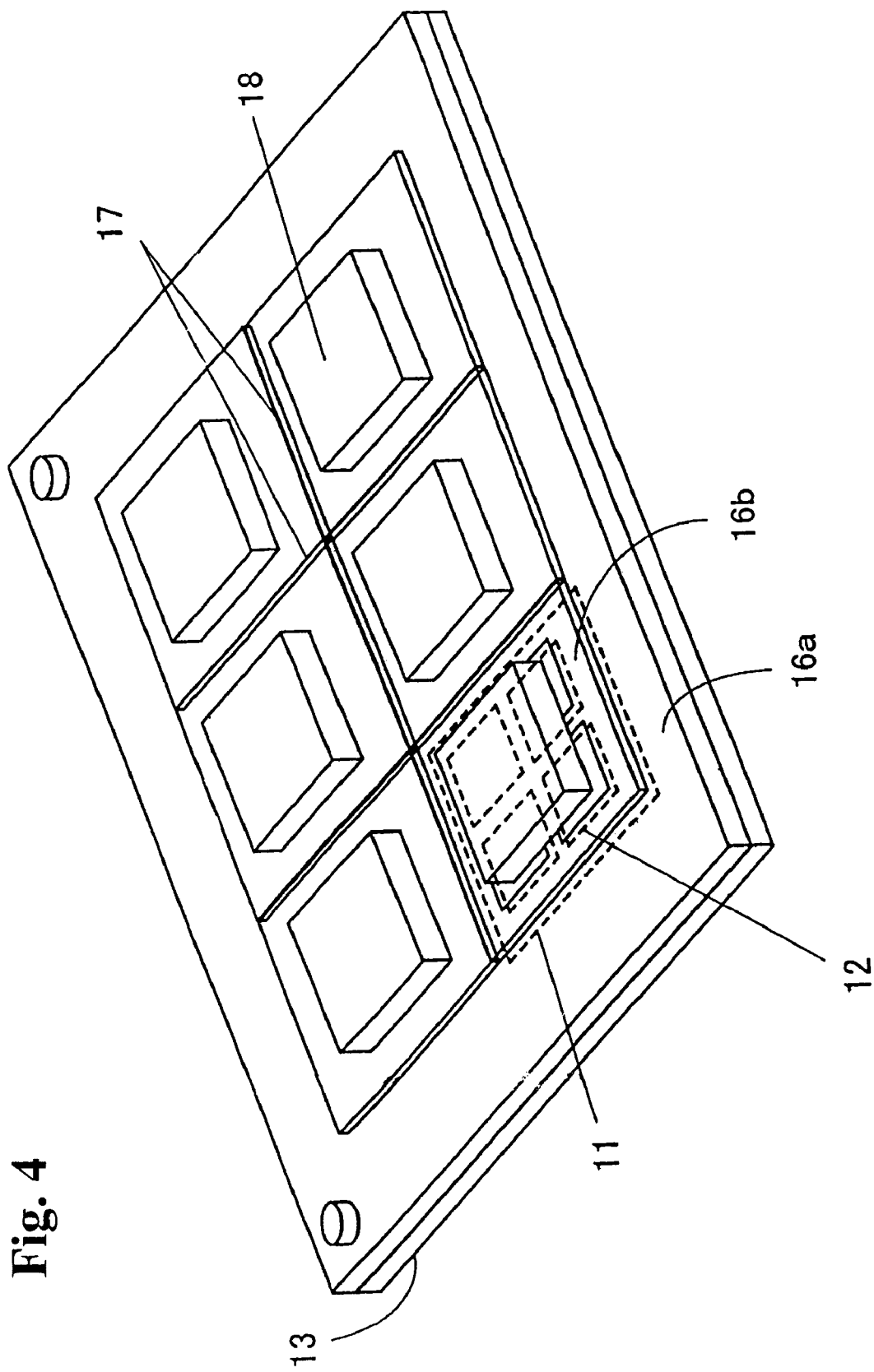
FIG. 4 is a perspective view showing a carbon jig fitted to a metal base.

FIG. 4 is a view showing a carbon jig attached to a metal base.

The carbon jig is made up of an outer frame 16a and an inner frame 16b, and fixes the positions of the circuit board 11, the semiconductor chips 12, the metal base 13 and the solder 14 (not shown here). And, a partition plate 17 is disposed above the dam part shown in FIG. 1, and when the quantity of solder is large, solder flow can be effectively prevented.

Because the partition plate 17 is disposed in the proximity of the solder bond parts, it is necessary to choose a material having a low solder wettability for the partition plate. Materials having a low solder wettability include ceramics. However, because ceramics have a high rigidity compared to carbon, the circuit boards 11 may break when the partition plate 17 is sandwiched between the circuit boards 11 due to contraction of the metal base 13 after soldering. Therefore, a partition plate 17 made of carbon is preferable. Weights 18 are for pressing down the circuit boards 11.

Bonding of the parts (the circuit boards 11, the semiconductor chips 12 and the metal base 13) is carried out by performing thermal soldering in a hydrogen atmosphere with the construction as shown in FIG. 4. By this means it is possible to prevent outflow of solder effectively, and prevention of mutual mechanical damaging of the circuit boards 11 and electrical insulation are achieved.

The disclosure of Japanese Patent Application No. 2005-027164 filed on Feb. 3, 2005, is incorporated herein.

What is claimed is:

1. A semiconductor device comprising:
  a plurality of circuit boards, each circuit board having a first side and a second side;
  semiconductor chips bonded to the first sides of the circuit boards;
  a metal base for dissipating heat produced by the semiconductor chips, the metal base being bonded to the second sides of the circuit boards; and a dam material disposed on the metal base for restricting flow of a solder used for bonding the plurality of the circuit boards to the metal base, said dam material being arranged on the metal base to prevent the solder from flowing from one circuit board to another circuit board.

2. A semiconductor device according to claim 1, wherein said dam material is a painted material disposed in a predetermined pattern.

3. A semiconductor device comprising:
a circuit board;
a semiconductor chip bonded to a first side of the circuit board;
a metal base for dissipating heat produced by the semiconductor chip, the metal base being bonded to a second side of the circuit board; and
a dam material disposed on the metal base for restricting flow of a solder used in bonding a plurality of the circuit boards to the metal base,
wherein said dam material is a painted material disposed in a predetermined pattern, and the dam material comprises as a main component an inorganic substance having a high solder heat resistance.

4. A semiconductor device according to claim 3, wherein the dam material comprises a mixture of particles of the inorganic substance and a volatile binder.

5. A semiconductor device according to claim 3, wherein the inorganic substance is carbon or a ceramic.

6. A semiconductor device comprising:
a circuit board;
a semiconductor chip bonded to a first side of the circuit board;
a metal base for dissipating heat produced by the semiconductor chip, the metal base being bonded to a second side of the circuit board; and
a dam material disposed on the metal base for restricting flow of a solder used in bonding a plurality of the circuit boards to the metal base,
wherein said dam material comprises as a main component a material selected from the group consisting of a carbon, a ceramic, and metal with low solder wetting characteristics.

7. A semiconductor device according to claim 1, wherein the dam material protrudes from the metal base to separate the circuit boards situated adjacent to each other.

8. A semiconductor device according to claim 7, wherein the dam material is located outside the circuit boards and extends linearly continuously.

* * * * *